United States Patent
Lin et al.

(10) Patent No.: US 10,305,276 B2
(45) Date of Patent: May 28, 2019

(54) ESD PROTECTION CIRCUIT AND INTEGRATED CIRCUIT

(71) Applicant: National Taiwan Normal University, Taipei (TW)

(72) Inventors: Chun-Yu Lin, Hsinchu (TW); Chun-Yu Chen, Toufen (TW)

(73) Assignee: NATIONAL TAIWAN NORMAL UNIVERSITY, Taipei (TW)

(*) Notice: Subject to any disclaimer, the term of this patent is extended or adjusted under 35 U.S.C. 154(b) by 264 days.

(21) Appl. No.: 15/430,835

(22) Filed: Feb. 13, 2017

(65) Prior Publication Data
US 2018/0109105 A1 Apr. 19, 2018

(30) Foreign Application Priority Data
Oct. 19, 2016 (TW) .............................. 105133764 A

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC .................. H02H 9/046; H01L 27/0248
See application file for complete search history.

(56) References Cited

U.S. PATENT DOCUMENTS

| | | |
|---|---|---|
| 2005/0057866 A1 | 3/2005 | Mergens et al. |
| 2005/0280091 A1* | 12/2005 | Huang ................ H01L 27/0255 257/355 |
| 2013/0026550 A1 | 1/2013 | Yoshioka |
| 2015/0325569 A1 | 11/2015 | Lin |
| 2018/0054054 A1* | 2/2018 | Singor .................. H02H 9/046 |

* cited by examiner

*Primary Examiner* — Scott Bauer
(74) *Attorney, Agent, or Firm* — Muncy, Geissler, Olds & Lowe, P.C.

(57) ABSTRACT

An electrostatic discharge (ESD) protection circuit for providing ESD paths between a signal pad and a first or second power rail includes a first ESD protection module and a second ESD protection module. The first ESD protection module is coupled between the signal pad and the first power rail, and includes at least two first diodes and a first resistor. The first diodes are stacked with each other, and one of the first diodes is electrically connected with the first resistor in parallel. The second ESD protection module is coupled between the signal pad and the second power rail, and includes at least two second diodes and a second resistor. The second diodes are stacked with each other, and one of the second diodes is electrically connected with the second resistor in parallel. The signal pad is coupled between the stacked first diodes and the stacked second diodes.

18 Claims, 4 Drawing Sheets

ESD PROTECTION CIRCUIT AND INTEGRATED CIRCUIT

CROSS REFERENCE TO RELATED APPLICATIONS

This Non-provisional application claims priority under 35 U.S.C. § 119(a) on Patent Application No(s). 105133764 filed in Taiwan, Republic of China on Oct. 19, 2016, the entire contents of which are hereby incorporated by reference.

BACKGROUND OF THE INVENTION

Field of Invention

The present invention relates to an electrostatic discharge (ESD) protection circuit and an integrated circuit, which are applied to the high-speed circuit.

Related Art

Electrostatic discharge (ESD) is a major factor relating to the reliability of electronic devices. A proper ESD protection circuit is necessary for protecting the electronic device from damage by electrostatic.

In a general input/output circuit, the diode is configured for providing the needed ESD protection circuit. For example, the integrated circuit usually has two diodes configured as the ESD element. One diode is connected between the signal pad and a high voltage terminal $V_{DD}$, and the other diode is connected between the signal pad and a low voltage terminal $V_{SS}$. When an electrostatic pulse is incurred, the diode is triggered and conducted to discharge the ESD current. Accordingly, the diodes can protect the internal circuit of the integrated circuit from the damage of the electrostatic pulse.

Although the diodes have good ESD protection ability, it may generate parasitic capacitance due to its P-N junction structure. Unfortunately, the parasitic capacitance can seriously interfere the signal transmission and thus affect the performance of the integrated circuit.

Therefore, it is an important subject to provide a protection circuit having high ESD durability without affecting signal transmission.

SUMMARY OF THE INVENTION

An objective of the present invention is to provide an ESD protection circuit and an integrated circuit, which can effectively reduce the parasitic capacitance of the diodes, thereby maintaining a lower signal loss.

To achieve the above objective, the present invention discloses an ESD protection circuit, which is configured for providing ESD paths between a signal pad and a first or second power rail. The ESD protection circuit includes a first ESD protection module and a second ESD protection module. The first ESD protection module is coupled between the signal pad and the first power rail, and the second ESD protection module is coupled between the signal pad and the second power rail. The first ESD protection module includes at least two first diodes and a first resistor. The first diodes are stacked with each other, and the first resistor is electrically connected with one of the first diodes in parallel. The second ESD protection module includes at least two second diodes and a second resistor. The second diodes are stacked with each other, and the second resistor is electrically connected with one of the second diodes in parallel. The signal pad is coupled between the stacked first diodes and the stacked second diodes.

In one embodiment, a terminal of the first resistor is coupled to a P terminal of one of the first diodes and an N terminal of the other one of the first diodes, and a terminal of the second resistor is coupled to a P terminal of one of the second diodes and an N terminal of the other one of the second diodes.

In one embodiment, in the first ESD protection module, at least one of the first diodes is not connected to the first resistor in parallel. Besides, in the second ESD protection module, at least one of the second diodes is not connected to the second resistor in parallel.

In one embodiment, the first resistor is coupled between the first power rail and the first diode, which is not connected to the first resistor in parallel, and the second resistor is coupled between the signal pad and the second diode, which is not connected to the second resistor in parallel.

In one embodiment, the first resistor is coupled between the signal pad and the first diode, which is not connected to the first resistor in parallel, and the second resistor is coupled between the second power rail and the second diode, which is not connected to the second resistor in parallel.

In one embodiment, the first power rail has a high voltage, the second power rail has a low voltage, and the first diodes and the second diodes are in reverse connection.

In one embodiment, the signal pad is a high-speed signal pad.

In one embodiment, the signal pad is an input/output pad, an output pad, or an input pad.

In one embodiment, the ESD protection circuit is capable of operating in a first ESD mode, a second ESD mode, a third ESD mode or a fourth ESD mode. In the first ESD mode, when a positive ESD voltage is discharged from the signal pad through the second power rail, the first diodes and the first resistor is conducted so that the signal pad, the first ESD protection module, the first power rail, a clamping circuit and the second power rail form one of the ESD paths. In the second ESD mode, when a negative ESD voltage is discharged from the signal pad through the second power rail, the second diodes and the second resistor is conducted so that the signal pad, the second ESD protection module and the second power rail form one of the ESD paths. In the third ESD mode, when a positive ESD voltage is discharged from the signal pad through the first power rail, the first diodes and the first resistor is conducted so that the signal pad, the first ESD protection module and the first power rail form one of the ESD paths. In the fourth ESD mode, when a negative ESD voltage is discharged from the signal pad through the first power rail, the second diodes and the second resistor is conducted so that the signal pad, the second ESD protection module, the second power rail, the clamping circuit and the first power rail form one of the ESD paths.

To achieve the above objective, the present invention also discloses an integrated circuit including a signal pad, an ESD protection circuit as mentioned above, and an internal circuit. The ESD protection circuit is coupled to the signal pad, and the internal circuit is coupled to the ESD protection circuit and the signal pad.

As mentioned above, the ESD protection module of the ESD protection circuit includes at least two stacked diodes, and one of the diodes is connected to a non-parasitic resistor in parallel. Accordingly, it is possible to effectively decrease the parasitic capacitance of the ESD protection circuit without increasing the component layout. Besides, the invention can remain the good ESD ability under high-frequency operation. As a result, the ESD durability and signal transmission can be improved.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
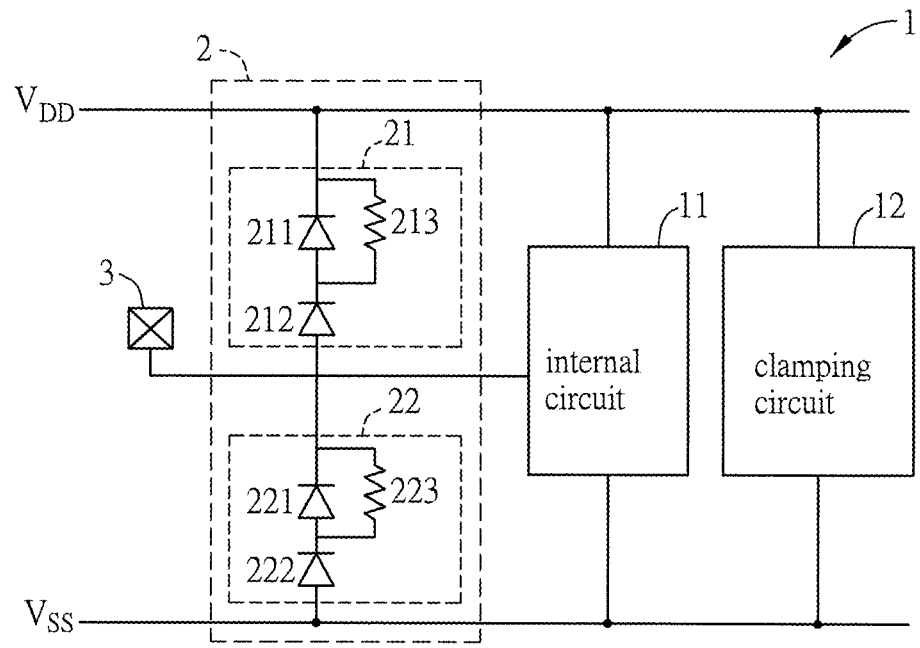
FIG. 1 is a schematic diagram showing an ESD protection circuit according to an embodiment of the invention.
Figure 2:
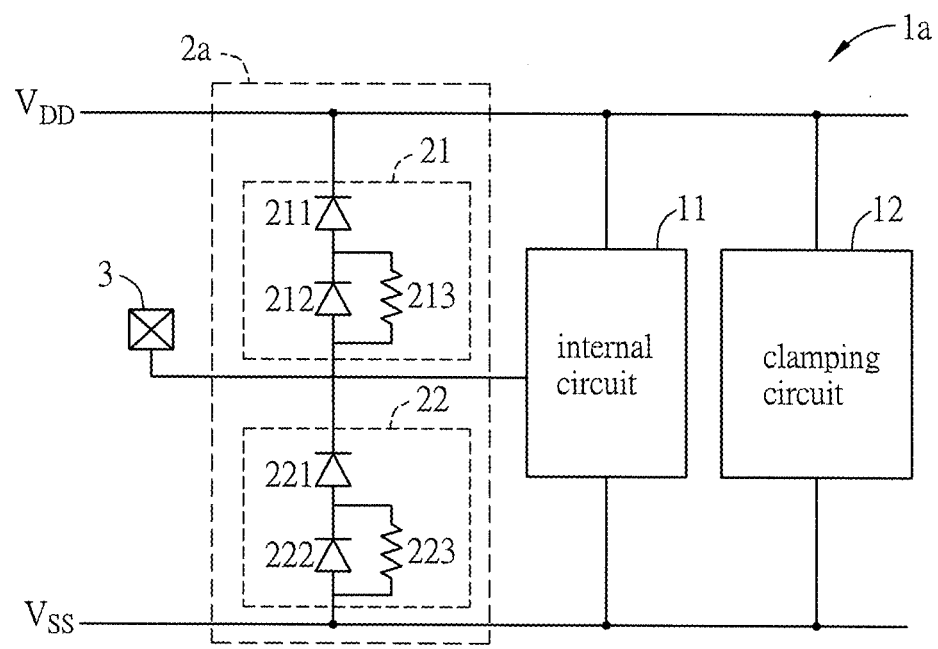
FIG. 2 is a schematic diagram showing an integrated circuit according to the embodiment of the invention.

FIG. 1 is a schematic diagram showing an ESD protection circuit according to an embodiment of the invention, and FIG. 2 is a schematic diagram showing an integrated circuit according to the embodiment of the invention. As shown in FIG. 1, the integrated circuit 1 includes a signal pad 3, an ESD protection circuit 2 and an internal circuit 11. The ESD protection circuit is coupled to the signal pad 3, and the internal circuit 11 is coupled to the ESD protection circuit 2 and the signal pad 3. The ESD protection circuit 2 provides ESD paths between the signal pad and a first power rail $V_{DD}$ or between the signal pad and a second power rail $V_{SS}$. For example, the first power rail $V_{DD}$ is a high voltage terminal, and the second power rail $V_{SS}$ is a low voltage terminal.

The signal pad 3 can be an input/output pad, an input pad or an output pad for signally communicating the internal circuit 11 with external circuits. In addition, the signal pad 3 is a high-speed signal pad, and the ESD protection circuit is formed by CMOS process. Accordingly, this invention can easily applied to the commercial IC products without special additional process.

The ESD protection circuit 2 includes a first ESD protection module 21 and a second ESD protection module 22. The first ESD protection module 21 is coupled between the signal pad 3 and the first power rail $V_{DD}$, and the second ESD protection module 22 is coupled between the signal pad 3 and the second power rail $V_{SS}$. The first ESD protection module 21 includes at least two first diodes 211 and 212 and a first resistor 213. The second ESD protection module 22 includes at least two second diodes 221 and 222 and a second resistor 223. The signal pad 3 is coupled to between the diodes 211 and 212 and the diodes 221 and 222. The diodes 211 and 212 and the diodes 221 and 222 are in reverse connection. In general, the first power rail $V_{DD}$ and the second power rail $V_{SS}$ apply reverse bias voltages to the diodes, so that these diodes are not conducted and the internal circuit 11 can normally operate for signally communicating through the signal pad 3.

In the first ESD protection module 21, the diodes 211 and 212 are stacked and connected in serial, and the first resistor 213 is electrically connected with one of the first diodes 211 and 212 in parallel. For example, the first resistor 213 is connected with the diode 211 in parallel. At least one of the diodes 211 and 212 is not connected with the first resistor 213 in parallel. For example, the diode 212 is not connected with the first resistor 213 in parallel, and the first resistor 213 is coupled between the first power rail $V_{DD}$ and the other diode 212.

In the second ESD protection module 22, the diodes 221 and 222 are stacked and connected in serial, and the second resistor 223 is electrically connected with one of the diodes 221 and 222 in parallel. For example, the second resistor 223 is connected with the diode 221 in parallel. At least one of the diodes 221 and 222 is not connected with the second resistor 223 in parallel. For example, the diode 222 is not connected with the second resistor 223 in parallel, and the second resistor 223 is coupled between the signal pad 3 and the other diode 222.

The stacked first and second diodes may include two or more diodes connected in serial. In this embodiment, the stacked first and second diodes include two diodes connected in serial. The number of the stacked diodes is not limited.

As shown in FIG. 2, the first resistor 213 can be connected to the diode 212 in parallel, and the second resistor 223 can be connected to the diode 222 in parallel.

In the first ESD protection module 21, the diodes 211 and 212 are stacked and connected in serial. The first resistor 213 is connected to one of the diodes 211 and 212 in parallel. For example, the first resistor 213 is connected to the diode 212 in parallel. At least another one of the diodes 211 and 212 is not connected to the first resistor 213 in parallel. For example, the diode 211 is not connected to the first resistor 213 in parallel. The first resistor 213 is coupled between the signal pad 3 and the diode 211, which is not connected to the first resistor 213 in parallel.

In the second ESD protection module 22, the diodes 221 and 222 are stacked and connected in serial. The second resistor 223 is connected to one of the diodes 221 and 222 in parallel. For example, the second resistor 223 is connected to the diode 222 in parallel. At least another one of the diodes 221 and 222 is not connected to the second resistor 223 in parallel. For example, the diode 221 is not connected to the second resistor 223 in parallel. The second resistor 223 is coupled between the second power rail $V_{SS}$ and the diode 221, which is not connected to the second resistor 223 in parallel.

In FIGS. 1 and 2, each ESD protection module includes stacked diodes, which are composed of two diodes connected in serial, and an individual non-parasitic resistor, which is connected to one of the diodes in parallel. The resistor and the diode, which are connected in parallel, are connected to the other diode in serial. When the ESD protection module includes three or more stacked diodes, the individual non-parasitic resistor is connected to another one of the diodes, which is not connected to the resistor in parallel. The resistor and the diode, which are connected in parallel, are connected to the other diodes in serial. At least one of the diodes is connected to the non-parasitic resistor in parallel. For example, three diodes are stacked, and the resistor is connected to one of the diodes in parallel. The resistor and the diode, which are connected in parallel, are connected to the other two diodes in serial. Alternatively, the resistor is connected to two of the diodes in parallel, and the resistor and the diodes, which are connected in parallel, are connected to the other diode in serial.

In one ESD protection module, a terminal of the resistor is coupled to a P terminal of one of the stacked diodes and an N terminal of the other one of the stacked diodes, and another terminal of the resistor is coupled to the signal pad or the power rail. As shown in FIGS. 1 and 2, a terminal of the first resistor 213 is coupled to a P terminal of one of the first diodes and an N terminal of the other one of the first diodes, and another terminal of the first resistor 213 is coupled to the signal pad 3 or the first power rail $V_{DD}$. Besides, a terminal of the second resistor 223 is coupled to a P terminal of one of the second diodes and an N terminal of the other one of the second diodes, and another terminal of the second resistor 223 is coupled to the signal pad 3 or the second power rail $V_{SS}$. For example, as shown in FIG. 1, a terminal of the first resistor 213 is coupled to a P terminal of the first diode 211 and an N terminal of the diode 212, and another terminal of the first resistor 213 is coupled to the first power rail $V_{DD}$. A terminal of the second resistor 223 is coupled to a P terminal of the diode 221 and an N terminal of the diode 222, and another terminal of the second resistor 223 is coupled to the signal pad 3. As shown in FIG. 2, a terminal of the first resistor 213 is coupled to a P terminal of the first diode 211 and an N terminal of the diode 212, and another terminal of the first resistor 213 is coupled to the signal pad 3. A terminal of the second resistor 223 is coupled to a P terminal of the diode 221 and an N terminal of the diode 222, and another terminal of the second resistor 223 is coupled to the second power rail $V_{SS}$. When the signal operation frequency increases, the parasitic capacitance effect of the stacked diodes may cause bad influence to the signal transmission. This invention utilizes the individual non-parasitic resistor to reduce the equivalent parasitic capacitance of the stacked diodes, thereby speeding the current conducting in the diodes, decreasing the parasitic effect, and thus lowering the signal loss.

As shown in FIGS. 1 and 2, the integrated circuit 1 or 2 may include an ESD clamping circuit 12 between the power rails. The clamping circuit 12 and the ESD protection circuit 2 or 2a can provide the proper ESD path between the signal pad 3 and the first power rail $V_{DD}$ or between the signal pad 3 and the second power rail $V_{SS}$ corresponding to the type of the generated electrostatics. The ESD protection circuit 2 or 2a can be operated in a first ESD mode, a second ESD mode, a third ESD mode or a fourth ESD mode according to the current situation. These ESD modes can be referred to a PS-mode (Positive-to-$V_{SS}$ mode), a PD-mode (Positive-to-$V_{DD}$ mode), an NS-mode (Negative-to-$V_{SS}$ mode), and an ND-mode (Negative-to-$V_{DD}$ mode).

The first, second, three and fourth ESD modes will be described hereinbelow with reference to FIGS. 3 to 6. Herein, $I_{ESD}$ represents the ESD current.

Figure 3:
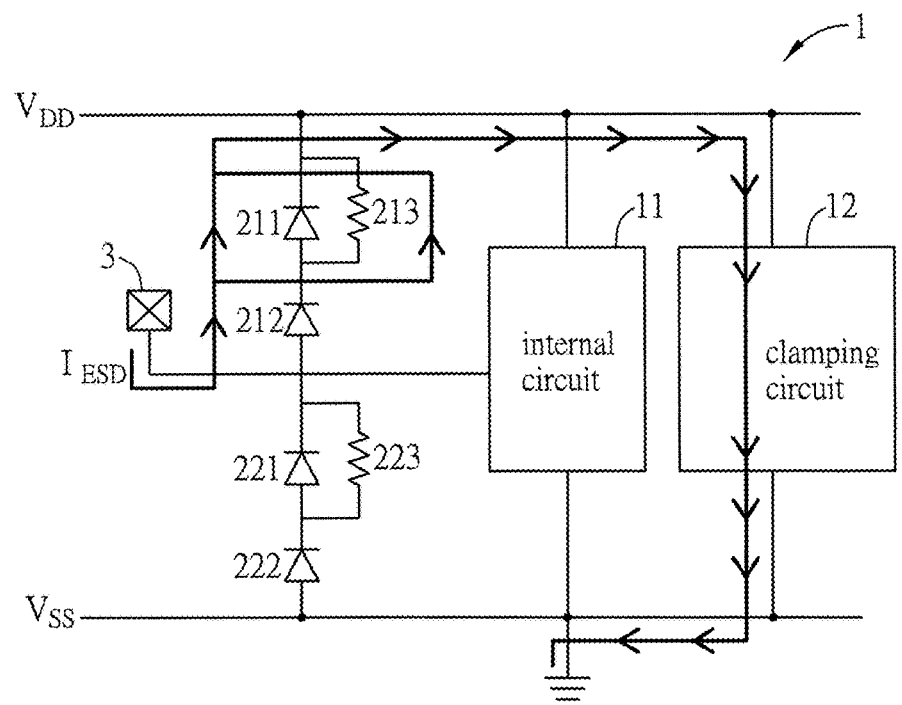
FIG. 3 is a schematic diagram showing the ESD protection circuit of FIG. 1 operated in a first ESD mode.

FIG. 3 is a schematic diagram showing the ESD protection circuit of FIG. 1 operated in a first ESD mode. Referring to FIGS. 1 and 3, in the first ESD mode (PS-mode), when a positive ESD voltage is applied to the signal pad 3 and discharged through the second power rail $V_{SS}$, which is grounded, the diodes 211 and 212 and the first resistor 213 are conducted to discharge the ESD current. In this case, the signal pad 3, the first ESD protection module 21, the first power rail $V_{DD}$, the clamping circuit 12 and the second power rail $V_{SS}$ form an ESD path.

Figure 4:
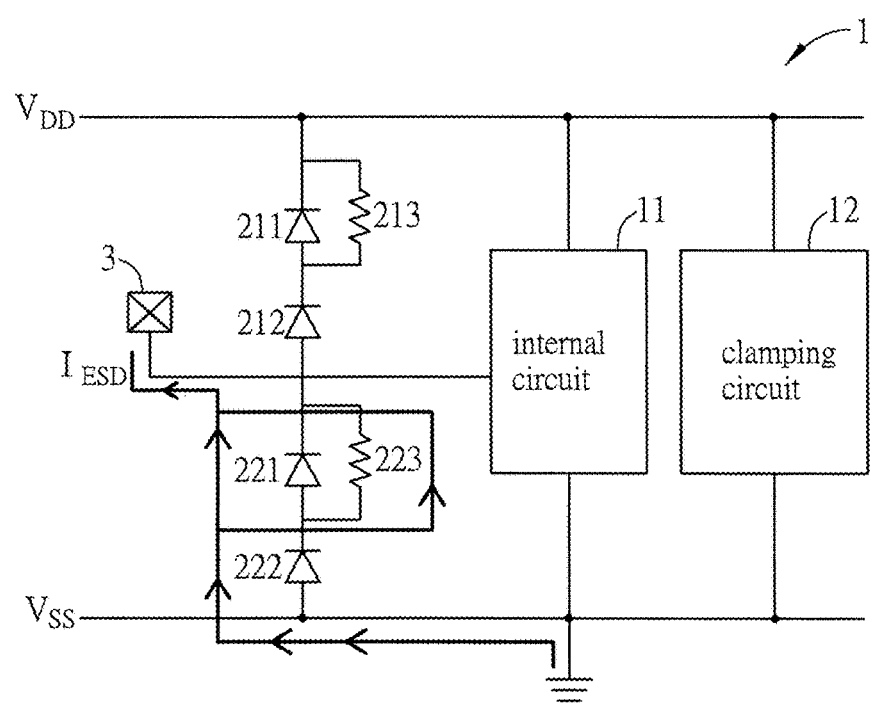
FIG. 4 is a schematic diagram showing the ESD protection circuit of FIG. 1 operated in a second ESD mode.

FIG. 4 is a schematic diagram showing the ESD protection circuit of FIG. 1 operated in a second ESD mode. Referring to FIGS. 1 and 4, in the second ESD mode (NS-mode), when a negative ESD voltage is applied to the signal pad 3 and discharged through the second power rail $V_{SS}$, which is grounded, the diodes 221 and 222 and the second resistor 223 are conducted to discharge the ESD current. In this case, the signal pad 3, the second ESD protection module 22 and the second power rail $V_{SS}$ form an ESD path.

Figure 5:
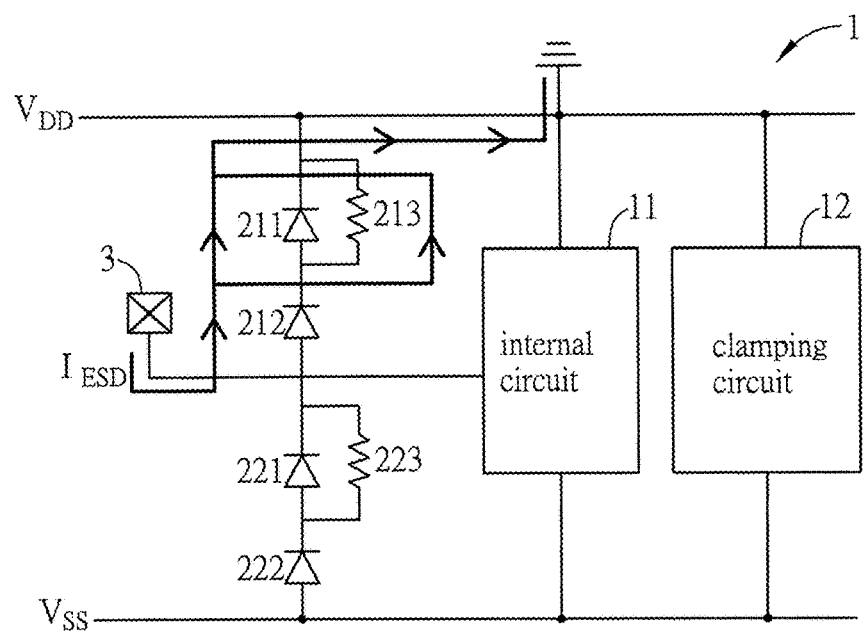
FIG. 5 is a schematic diagram showing the ESD protection circuit of FIG. 1 operated in a third ESD mode.

FIG. 5 is a schematic diagram showing the ESD protection circuit of FIG. 1 operated in a third ESD mode. Referring to FIGS. 1 and 5, in the third ESD mode (PD-mode), when a positive ESD voltage is applied to the signal pad 3 and discharged through the first power rail $V_{DD}$, which is grounded, the diodes 211 and 212 and the first resistor 213 are conducted to discharge the ESD current. In this case, the signal pad 3, the first ESD protection module 21 and the first power rail $V_{DD}$ form an ESD path.

Figure 6:
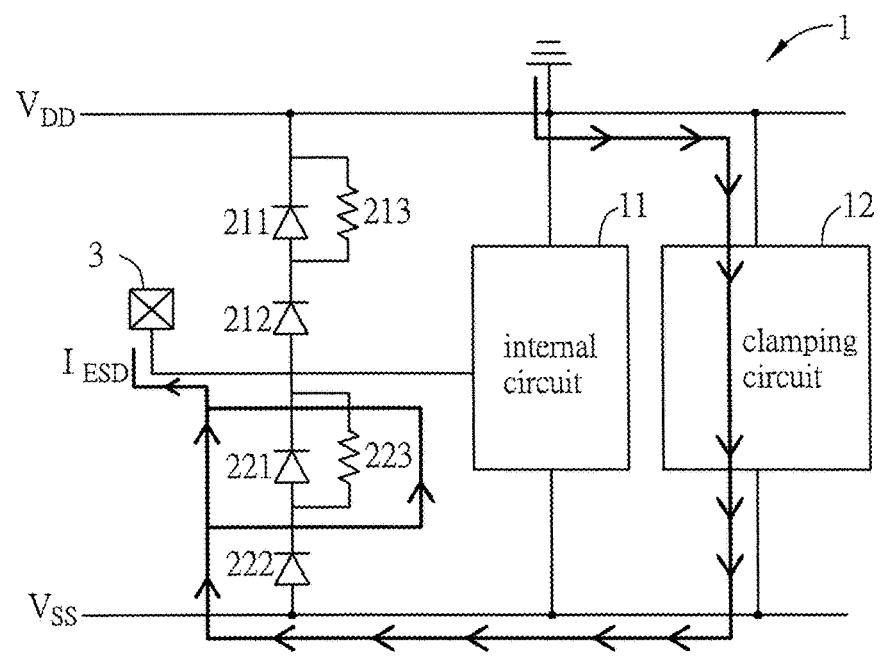
FIG. 6 is a schematic diagram showing the ESD protection circuit of FIG. 1 operated in a fourth ESD mode.

FIG. 6 is a schematic diagram showing the ESD protection circuit of FIG. 1 operated in a fourth ESD mode. Referring to FIGS. 1 and 6, in the fourth ESD mode (ND-mode), when a negative ESD voltage is applied to the signal pad 3 and discharged through the first power rail $V_{DD}$, which is grounded, the diodes 221 and 222 and the second resistor 223 are conducted to discharge the ESD current. In this case, the signal pad 3, the second ESD protection module 22, the second power rail $V_{SS}$, the clamping circuit 12 and the first power rail $V_{DD}$ form an ESD path.

Figure 7:
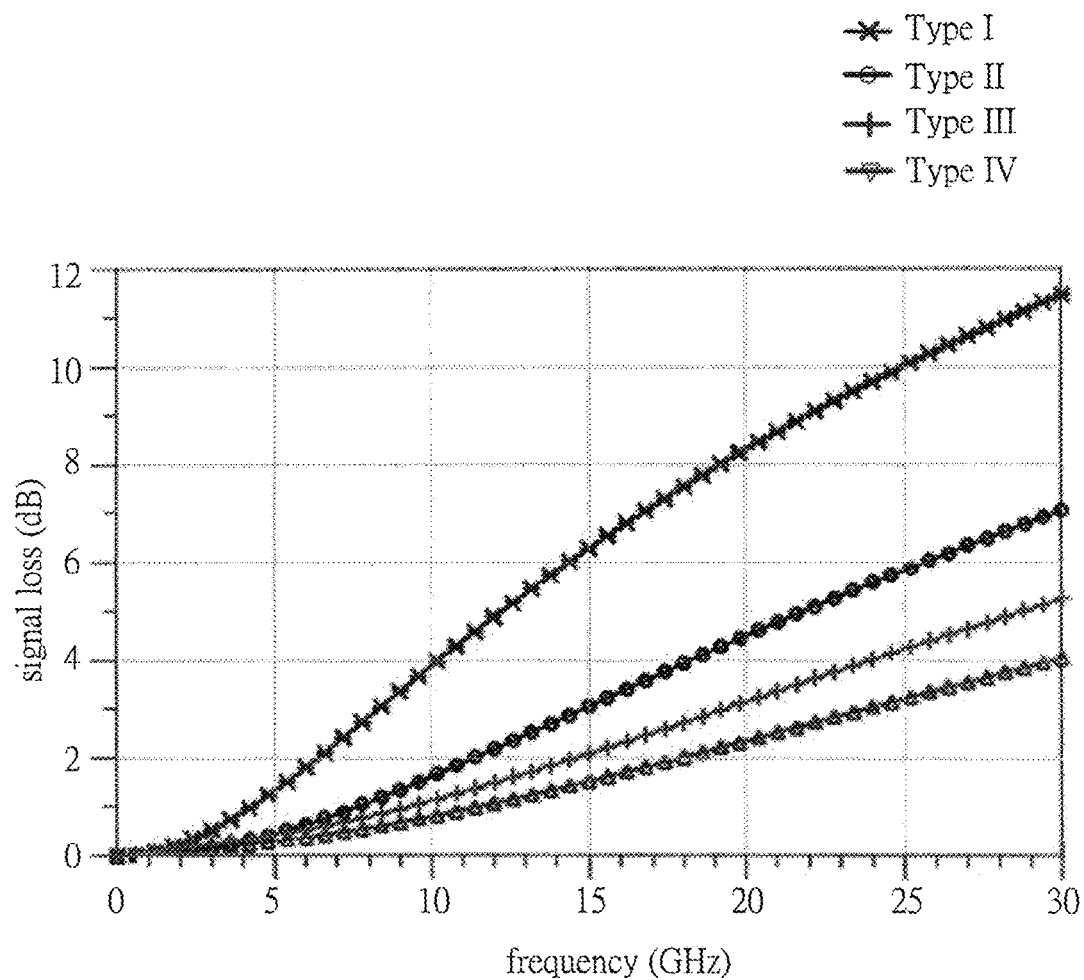
FIG. 7 is a schematic chart showing the signal losses of different ESD protection circuits.

FIG. 7 is a schematic chart showing the signal losses of different ESD protection circuits. Type I shows a general ESD protection circuit containing two diodes. Type II shows an ESD protection circuit containing two sets of stacked diodes, and each set of stacked diodes includes two stacked diodes. Type III shows an ESD protection circuit containing two sets of stacked diodes and resistor, and each set of stacked diodes and resistor includes two stacked diodes and one resistor. The resistor is connected between the two stacked diodes in serial (diode-resistor-diode). Type IV is an ESD protection circuit as shown in FIG. 1. As shown in FIG. 7, under the high-frequency operation, Type IV has the circuit design with stacked diodes and a resistor connected in parallel. Thus, the ESD protection circuit of the invention can effectively decrease the parasitic effect caused by the diodes in the conventional ESD protection circuit without configuring extra components. As a result, the invention has lower signal loss than the conventional circuit designs and is capable of sufficiently increasing the signal transmission performance.

In summary, the ESD protection module of the ESD protection circuit includes at least two stacked diodes, and one of the diodes is connected to a non-parasitic resistor in parallel. Accordingly, it is possible to effectively decrease the parasitic capacitance of the ESD protection circuit without increasing the component layout. Besides, the invention can remain the good ESD ability under high-frequency operation. As a result, the ESD durability and signal transmission can be improved.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electrostatic discharge (ESD) protection circuit, which is configured for providing ESD paths between a signal pad and a first or second power rail, comprising:
   a first ESD protection module coupled between the signal pad and the first power rail, and comprising:
   at least two first diodes stacked with each other, and a first resistor electrically connected with one of the first diodes in parallel; and
a second ESD protection module coupled between the signal pad and the second power rail, and comprising:
at least two second diodes stacked with each other, and
a second resistor electrically connected with one of the second diodes in parallel;
wherein, the signal pad is coupled between the stacked first diodes and the stacked second diodes, and only one resistor of the first resistor of the first ESD protection module and the second resistor of the second ESD protection module is directly coupled to the signal pad.

2. The ESD protection circuit of claim 1, wherein a terminal of the first resistor is coupled to a P terminal of one of the first diodes and an N terminal of the other one of the first diodes, and a terminal of the second resistor is coupled to a P terminal of one of the second diodes and an N terminal of the other one of the second diodes.

3. The ESD protection circuit of claim 2, wherein
in the first ESD protection module, at least one of the first diodes is not connected to the first resistor in parallel; and
in the second ESD protection module, at least one of the second diodes is not connected to the second resistor in parallel.

4. The ESD protection circuit of claim 3, wherein
the first resistor is coupled between the first power rail and the first diode, which is not connected to the first resistor in parallel; and
the second resistor is coupled between the signal pad and the second diode, which is not connected to the second resistor in parallel.

5. The ESD protection circuit of claim 3, wherein
the first resistor is coupled between the signal pad and the first diode, which is not connected to the first resistor in parallel; and
the second resistor is coupled between the second power rail and the second diode, which is not connected to the second resistor in parallel.

6. The ESD protection circuit of claim 1, wherein the first power rail has a high voltage, the second power rail has a low voltage, and the first diodes and the second diodes are in reverse connection.

7. The ESD protection circuit of claim 1, wherein the signal pad is a high-speed signal pad.

8. The ESD protection circuit of claim 1, wherein the signal pad is an input/output pad, an output pad, or an input pad.

9. The ESD protection circuit of claim 1, which is capable of operating in:
a first ESD mode, wherein when a positive ESD voltage is discharged from the signal pad through the second power rail, the first diodes and the first resistor is conducted so that the signal pad, the first ESD protection module, the first power rail, a clamping circuit and the second power rail form one of the ESD paths;
a second ESD mode, wherein when a negative ESD voltage is discharged from the signal pad through the second power rail, the second diodes and the second resistor is conducted so that the signal pad, the second ESD protection module and the second power rail form one of the ESD paths;
a third ESD mode, wherein when a positive ESD voltage is discharged from the signal pad through the first power rail, the first diodes and the first resistor is conducted so that the signal pad, the first ESD protection module and the first power rail form one of the ESD paths; and
a fourth ESD mode, wherein when a negative ESD voltage is discharged from the signal pad through the first power rail, the second diodes and the second resistor is conducted so that the signal pad, the second ESD protection module, the second power rail, the clamping circuit and the first power rail form one of the ESD paths.

10. An integrated circuit, comprising:
an electrostatic discharge (ESD) protection circuit, which is configured for providing ESD paths between a signal pad and a first or second power rail, the ESD protection circuit comprising:
a first ESD protection module coupled between the signal pad and the first power rail, and comprising:
at least two first diodes stacked with each other, and
a first resistor electrically connected with one of the first diodes in parallel; and
a second ESD protection module coupled between the signal pad and the second power rail, and comprising:
at least two second diodes stacked with each other, and
a second resistor electrically connected with one of the second diodes in parallel;
wherein, the signal pad is coupled between the stacked first diodes and the stacked second diodes, and only one resistor of the first resistor of the first ESD protection module and the second resistor of the second ESD protection module is directly coupled to the signal pad;
the signal pad coupled to the ESD protection circuit; and
an internal circuit coupled to the ESD protection circuit and the signal pad.

11. The integrated circuit of claim 10, wherein a terminal of the first resistor is coupled to a P terminal of one of the first diodes and an N terminal of the other one of the first diodes, and a terminal of the second resistor is coupled to a P terminal of one of the second diodes and an N terminal of the other one of the second diodes.

12. The integrated circuit of claim 11, wherein
in the first ESD protection module, at least one of the first diodes is not connected to the first resistor in parallel; and
in the second ESD protection module, at least one of the second diodes is not connected to the second resistor in parallel.

13. The integrated circuit of claim 12, wherein
the first resistor is coupled between the first power rail and the first diode, which is not connected to the first resistor in parallel; and
the second resistor is coupled between the signal pad and the second diode, which is not connected to the second resistor in parallel.

14. The integrated circuit of claim 12, wherein
the first resistor is coupled between the signal pad and the first diode, which is not connected to the first resistor in parallel; and
the second resistor is coupled between the second power rail and the second diode, which is not connected to the second resistor in parallel.

15. The integrated circuit of claim 10, wherein the first power rail has a high voltage, the second power rail has a low voltage, and the first diodes and the second diodes are in reverse connection.

16. The integrated circuit of claim 10, wherein the signal pad is a high-speed signal pad.

17. The integrated circuit of claim 10, wherein the signal pad is an input/output pad, an output pad, or an input pad.

18. The integrated circuit of claim 10, which is capable of operating in:
- a first ESD mode, wherein when a positive ESD voltage is discharged from the signal pad through the second power rail, the first diodes and the first resistor is conducted so that the signal pad, the first ESD protection module, the first power rail, a clamping circuit and the second power rail form one of the ESD paths;
- a second ESD mode, wherein when a negative ESD voltage is discharged from the signal pad through the second power rail, the second diodes and the second resistor is conducted so that the signal pad, the second ESD protection module and the second power rail form one of the ESD paths;
- a third ESD mode, wherein when a positive ESD voltage is discharged from the signal pad through the first power rail, the first diodes and the first resistor is conducted so that the signal pad, the first ESD protection module and the first power rail form one of the ESD paths; and
- a fourth ESD mode, wherein when a negative ESD voltage is discharged from the signal pad through the first power rail, the second diodes and the second resistor is conducted so that the signal pad, the second ESD protection module, the second power rail, the clamping circuit and the first power rail form one of the ESD paths.

* * * * *